(12) United States Patent
Kotani et al.

(10) Patent No.: US 6,245,466 B1
(45) Date of Patent: Jun. 12, 2001

(54) MASK PATTERN DESIGN METHOD AND A PHOTOMASK

(75) Inventors: Toshiya Kotani, Sagamihara; Satoshi Tanaka, Kawasaki; Soichi Inoue, Yokohama, all of (JP)

(73) Assignee: Kabushiki Kaisha Toshiba, Kawaskai (JP)

( * ) Notice: Subject to any disclaimer, the term of this patent is extended or adjusted under 35 U.S.C. 154(b) by 0 days.

(21) Appl. No.: 09/358,769

(22) Filed: Jul. 22, 1999

(30) Foreign Application Priority Data

Jul. 23, 1998 (JP) .................................................. 10-208056

(51) Int. Cl.$^7$ ...................................................... G03F 9/00
(52) U.S. Cl. ................................................................ 430/5
(58) Field of Search ............................... 430/5, 296, 322; 250/492.22

(56) References Cited

U.S. PATENT DOCUMENTS 6,080,527 * 6/2000 Huang et al. ............................ 430/5

FOREIGN PATENT DOCUMENTS 6-242595   9/1994   (JP) .
8-153136   6/1996   (JP) .

* cited by examiner

*Primary Examiner*—S. Rosasco
(74) *Attorney, Agent, or Firm*—Finnegan, Henderson, Farabow, Garrett & Dunner, L.L.P.

(57) ABSTRACT

A rectangular supplemental pattern having two edges of dimensions $s_1$ and $s_2$ is added to a main pattern corresponding to a design pattern. Where a change amount of shortening with respect to small changes $\Delta s_1$ and $\Delta s_2$ of the plan shape of the supplemental pattern, the plan shape of the supplemental pattern is determined such that the change amount $s'=\{(\pm\Delta x/\pm\Delta s_1)^2+(\pm\Delta x/\pm\Delta s_1)^2\}^{1/2}$ of the pattern plan shape on a wafer after transfer becomes a predetermined value or less.

10 Claims, 7 Drawing Sheets

MASK PATTERN DESIGN METHOD AND A PHOTOMASK

BACKGROUND OF THE INVENTION

The present invention relates to a mask pattern design method and a photomask useful for designing a fine supplemental pattern.

In recent years, the semiconductor manufacturing techniques have extremely progressed, and semiconductor devices having a minimum processible size of 0.35 µm have been manufactured in these days. This fine downsizing of devices is realized by rapid progress of a fine pattern forming technique called an optical lithography technique.

The optical lithography means a series of steps of: forming a mask from a design pattern of an LSI; irradiating light on the mask to expose a resist coated on the wafer in accordance with a pattern drawn on the mask by a projection optical system; and developing the resist based on the exposure distribution thereby to form a resist pattern on the wafer. By etching under layers with use of the resist pattern formed through the optical lithography steps, as a mask, an LSI pattern is formed on the wafer.

In a generation in which the pattern size was sufficiently large compared with the limit resolution of a projection optical system, the plan shape of the LSI pattern desired to be formed on the wafer was directly drawn as a design pattern. Further, a mask pattern having fidelity to the design pattern was prepared. The mask pattern thus obtained was transferred onto a wafer by a projection optical system, and under layers were etched. In this manner, a pattern substantially similar to the design pattern was formed on the wafer.

However, as the patterns have come to become finer and smaller, the pattern formed on the wafer differs from a design pattern due to influences from an eclipse iof diffracted light in a projection optical system (which will be hereinafter called an optical proximity effect), accompanying remarkable bad influences.

For example, in case of a gate pattern, the top end portion of the pattern becomes shorter than that of a design pattern (which will be hereinafter called "shortening"), or corner portions of a device region such as SDG or the like are rounded (which will be hereinafter called "rounding"). These shortening and rounding are factors which cause operation errors of transistors. Also, in case of forming a dense Line and Space (L/S) pattern, the line width of an isolated pattern existing in the same layer as the L/S pattern becomes thicker or narrower than that of a finished L/S pattern. This is a factor which deteriorates the operation characteristics of the device.

To eliminate these problems, there has been a proposal for a method in which correction is made by adding a fine small supplemental pattern to the portion of a pattern where the optical proximity effect appears, thereby to prepare a mask design plan different from a conventional design pattern, and a mask is prepared in accordance with the mask design plan. An example thereof is disclosed in Japanese Patent Application KOKAI Publication No. 6-242595. The method of transfer with use of a mask prepared by adding a fine small supplemental pattern to a design pattern is effective for forming a pattern with fidelity to the design pattern on a wafer.

However, the size of this supplement pattern is generally very small. More specifically, the dimensions of this supplemental pattern, as formed on a a wafer, are in the several-ten nm range. Consequently, errors in mask dimensions or rounding at corner portions, which are caused by mask drawing process, greatly influence the finished dimensions after transfer. Therefore, it is difficult to obtain an optical proximity effect stably. Also, improvements in precision of the mask drawing process require techniques which further require much labor.

Thus, in a conventional method, finished dimensions of a supplemental pattern vary due to the mask drawing process. As a result of this, it is difficult to stably attain a desired correction effect in a pattern after transfer.

BRIEF SUMMARY OF THE INVENTION

The present invention has an object of providing a mask pattern design method which is capable of stably attaining a correction effect by means of a supplemental pattern without improving the precision of mask drawing process.

Also, the present invention has another object of providing a photomask which is capable of stably attaining a correction effect by means of a supplemental pattern without improving the precision in mask drawing.

According to the present invention, there is provided a mask pattern design method for designing a pattern of a photomask used for forming a desired design pattern onto a wafer by a projection exposure device, wherein a mask pattern is prepared by adding a supplemental pattern to a main pattern corresponding to the design pattern, and a plan shape of the supplemental pattern is determined such that a change rate of a pattern plan shape on the wafer after transfer, which is defined based on a change amount of the plan shape of the supplemental pattern and a change amount of the pattern plan shape, becomes a predetermined allowable value or less.

The main pattern corresponding to a design pattern, used herein, means a pattern having the same shape as the design pattern to be formed on a wafer.

Also, according to the present invention, there is provided a photomask used for forming a desired design pattern onto a wafer by a projection exposure device, wherein a mask pattern of the photomask comprises a main pattern corresponding to the design pattern and a supplemental pattern added to the main pattern, and a plan shape of the supplemental pattern is determined such that a change rate of a pattern plan shape on the wafer after transfer, which is defined based on a change amount of the plan shape of the supplemental pattern and a change amount of the pattern plan shape on the wafer after transfer, becomes a predetermined allowable value or less.

The main pattern corresponding to a design pattern, used herein, also means a pattern having the same shape as the design pattern to be formed on a wafer.

Also, the change rate of a pattern plan shape, described herein, is a value indicating the extent of a change of the pattern plan shape which appears on a wafer after transfer, relative to a change of the plan shape of a supplemental pattern.

In the present invention, a supplemental pattern is added to a main pattern having the same shape as a design pattern to be transferred. The plan shape of the supplemental pattern is determined such that the change amount of a pattern plan shape on a wafer after transfer in relation to a change of the plan shape of the supplemental pattern becomes a predetermined allowable value or less. In this manner, variations of the dimensions of the pattern after transfer, which are caused by variations of the dimensions of the supplemental pattern, can be restricted to be small. As a result of this, a correction effect desired for the pattern after transfer can be obtained stably.

Also, in the present invention, the change amount of the pattern plan shape on the wafer is standardized by the values of the exposure wavelength λ of a light source of a projection exposure device and the numerical aperture NA of a projection lens thereof. In this manner, the standardized change amount is determined as one single meaning even if λ and NA differ. Therefore, it is possible to respond flexibly to changes of illumination conditions (λ and NA), so enormous processing and time required for designing a mask pattern can be shortened.

In addition, the plan shape of the supplemental pattern is determined such that the change amount of the pattern plan shape on the wafer after transfer in relation to a change in the mask plane which is caused by mask drawing process becomes a predetermined value or less. In this manner, it is possible to calculate a change amount of the plan shape on the wafer, based on variations of the dimensions of the supplemental pattern which are caused in actual drawing process. Therefore, the plan shape of the supplemental pattern capable of more stably attaining a correction effect can be determined.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

In the following, an embodiment of the present invention will be explained with reference to the drawings.

FIRST EMBODIMENT

Figure 1:
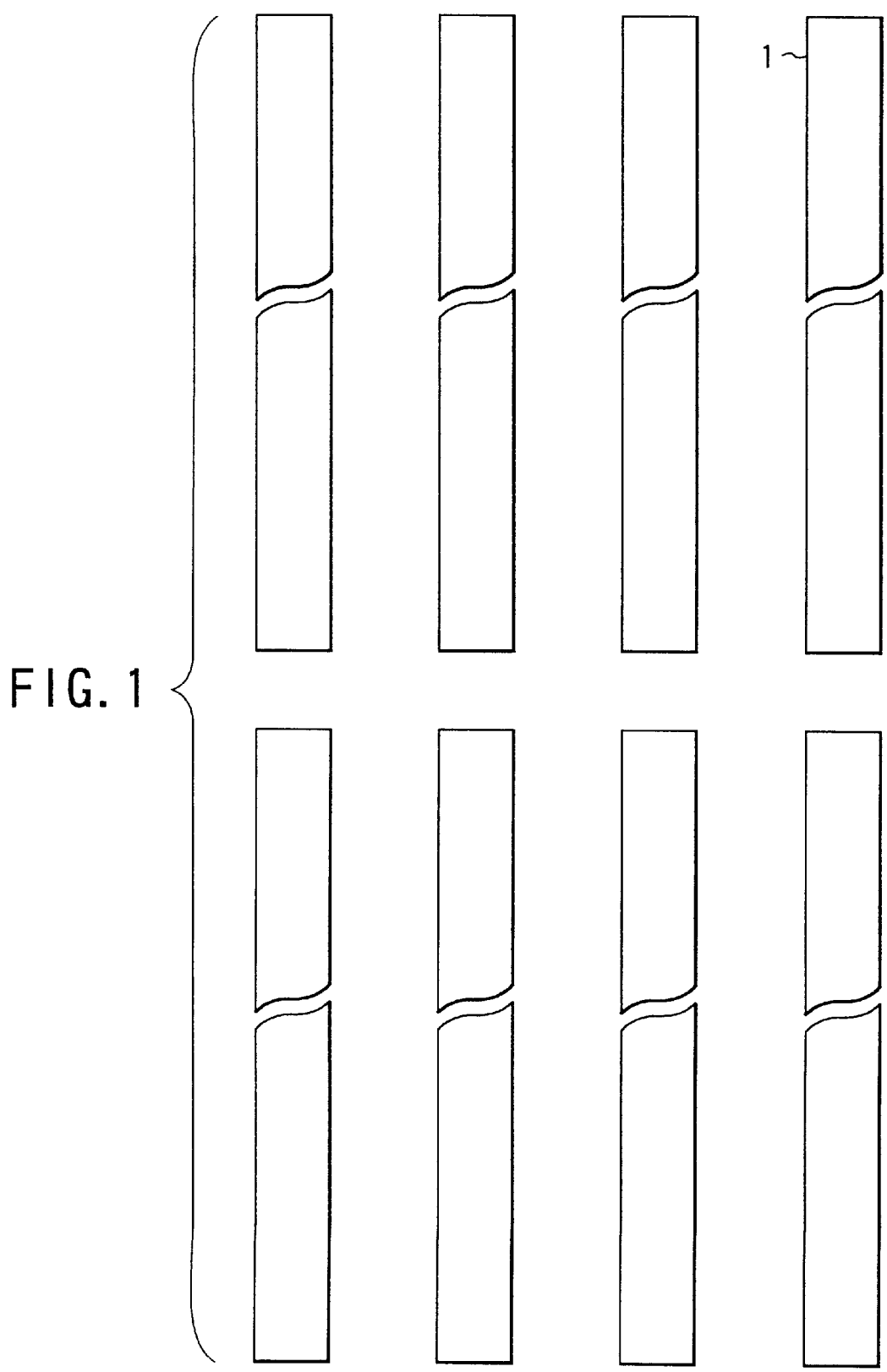
FIG. 1 is a plan view of a design pattern according to the first embodiment of the present invention.

FIGS. 1 to 4 are views for explaining the pattern design method according to the first embodiment of the present invention. FIG. 1 is a plan view showing a gate pattern to be transferred in the present embodiment. In the following, the gate pattern to be transferred onto a wafer will be called a design pattern 1.

The design pattern 1 is an L/S (Line and Space) pattern of 1:1 with a line width of 0.18 μm, and an L/S pattern having the same cycle exists at a position distant by 0.18 μm from an upper portion of the pattern.

Figure 2:
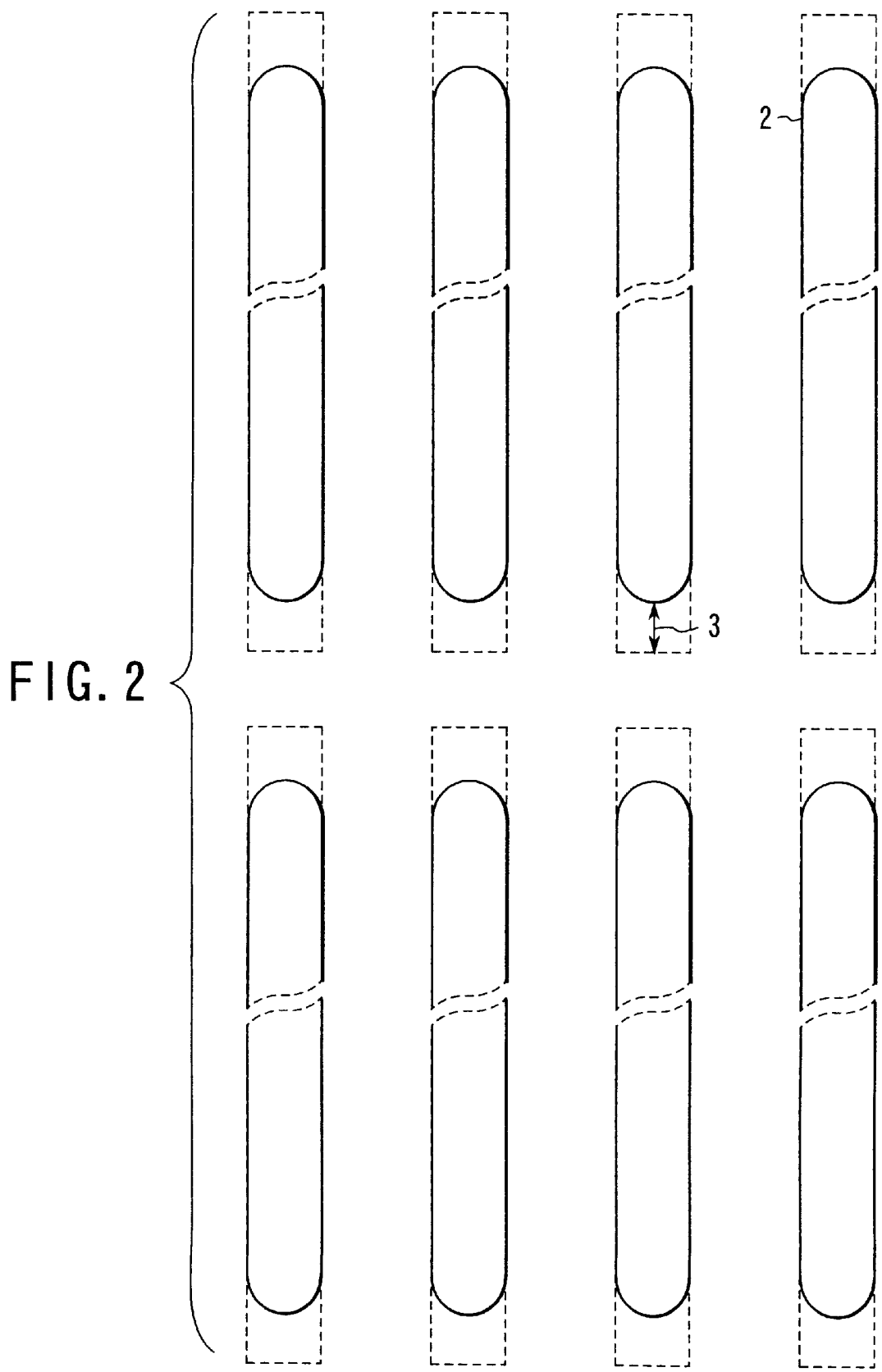
FIG. 2 is a plan view of a transferred pattern with use of a photomask before adding a supplemental pattern, according to the second embodiment.

With use of a mask pattern having the same plan shape as the design pattern 1, exposure is carried out under a condition that the exposure wavelength is λ=0.248 μm, the numerical aperture of a projection optical system is NA=0.6, and the partial coherence is σ=0.75. If resist development is carried out after exposure, the top end portion of the transferred pattern is finished to be shorter than a desired length (this will be hereinafter called "shortening"). This transferred pattern is shown in FIG. 2. A shown in FIG. 2, the transferred pattern 2 has a pattern length shorter than the design pattern 1 indicated by a broken line, and thus, occurrence of shortening 3 is found.

Figure 3:
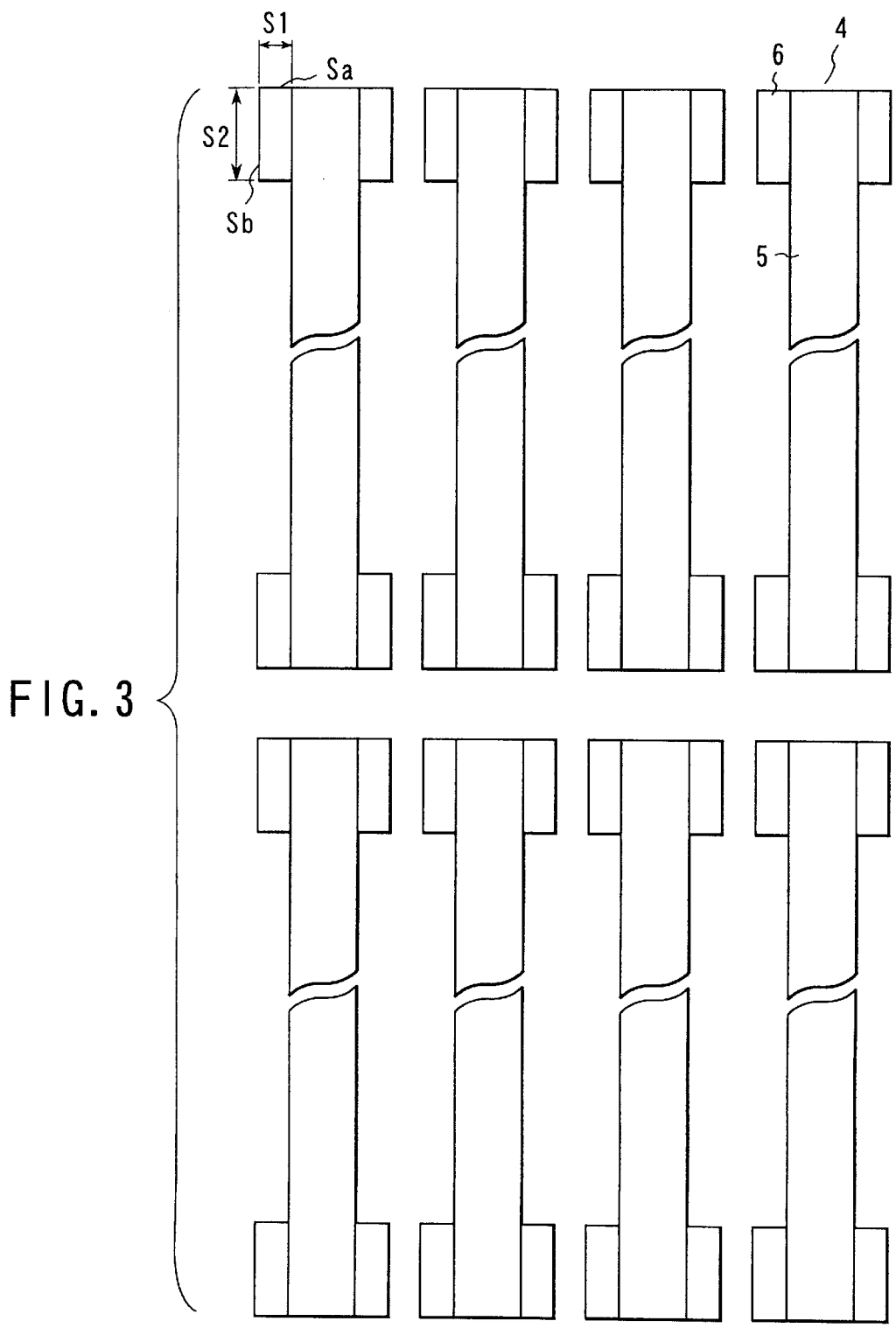
FIG. 3 is a plan view of a mask pattern according to the embodiment.
Figure 4:
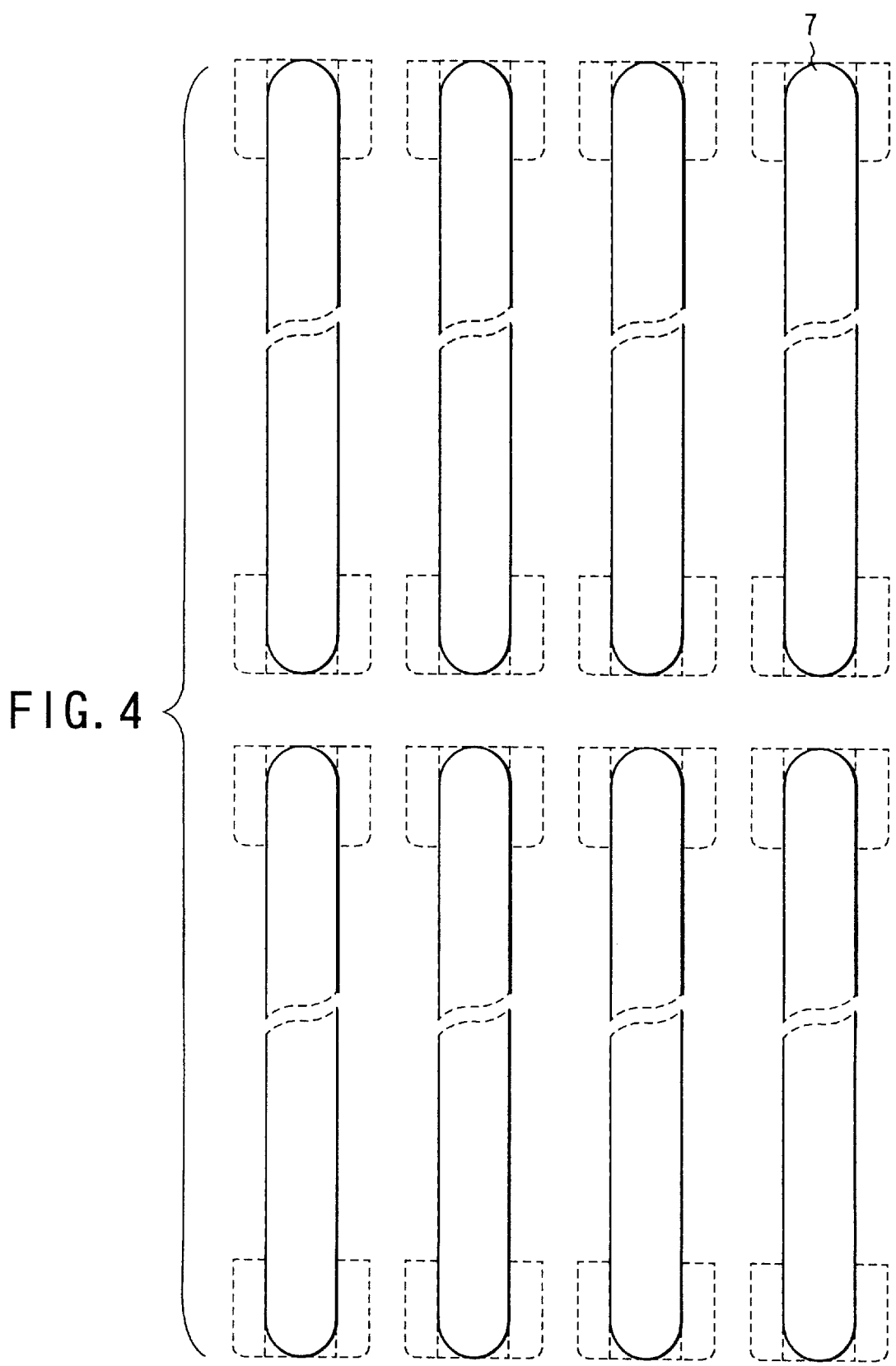
FIG. 4 is a plan view of a transferred pattern with use of a photomask after adding a supplemental pattern, according to the embodiment.

To obtain a transferred pattern having a desired pattern length by correcting this shortening 3, pattern transfer is carried out with use of a mask pattern having a corrected shape different from the design pattern 1. FIG. 3 is a plan view showing a corrected mask pattern. As shown in FIG. 3, a supplemental pattern 6, which has a lateral edge sa of $s_1$ (nm) (in the pattern width direction of the main pattern 5) and a longitudinal edge sb of $s_2$ (nm) (in the pattern length direction of the main pattern 5), is added to the top end portion of the main pat tern 5 which has the same shape as the design pattern 1, thereby to widen the pattern width at the top end portion. A transferred pattern 7 transferred by the corrected pattern is shown in FIG. 4. As shown in FIG. 4, it is found that shortening is eliminated and the transferred shape approximates to a desired pattern, in comparison with the transferred pattern 2 not corrected.

Figure 5:
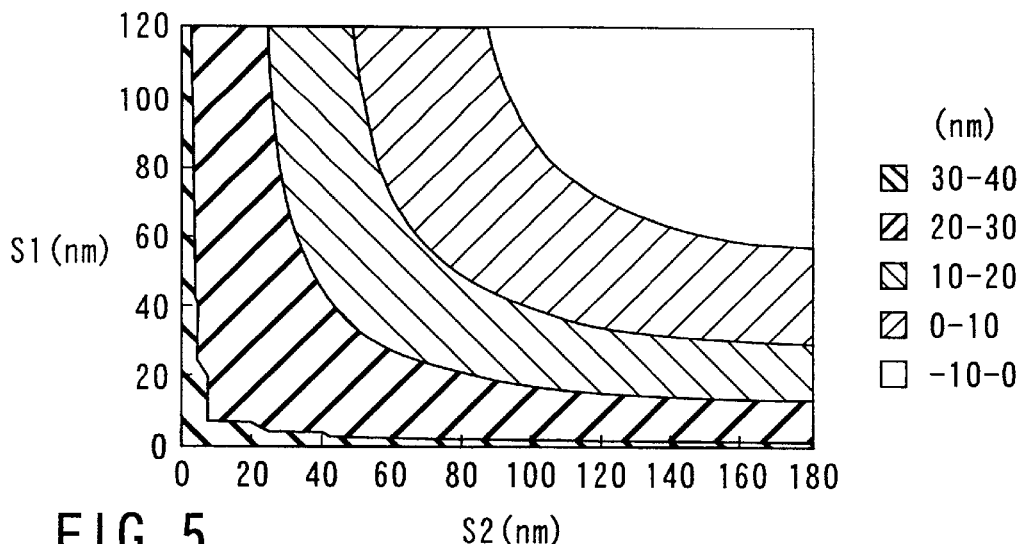
FIG. 5 is a graph showing the shortening in relation to dimensions sa and sb.

As for the supplemental pattern 6, to determine a supplement pattern 6 having an optimum shape, shortening is estimated by simulations in case where the dimensions $s_1$ and $s_2$ of the edges sa and sb of the supplemental pattern 6 are changed variously. FIG. 5 shows the results. The lateral axis represents the length $s_1$ of the edge sa and the longitudinal axis represents the length $s_2$ of the edge sb. As shown in FIG. 5, the combination of the lengths sa and sb that reduces shortening to 0 is expressed by a boundary line between the region where the shortening is 0 to 10 (nm) and the region where the shortening is −10 to 0 (nm). It is hence found that the combination is not limited to only one combination but there are innumerable combinations.

Figure 6:
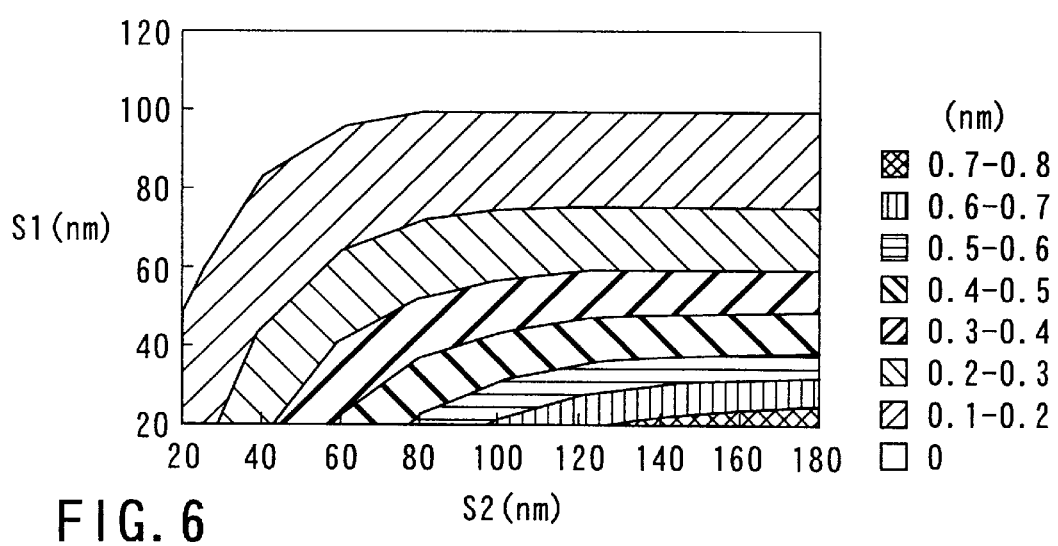
FIG. 6 is a graph showing the change amount of shortening when sa is changed by 1 nm.

Next, FIG. 6 shows the change amount of the shortening in the case where only the length $s_1$ is changed by a unit length (1 nm).

Figure 7:
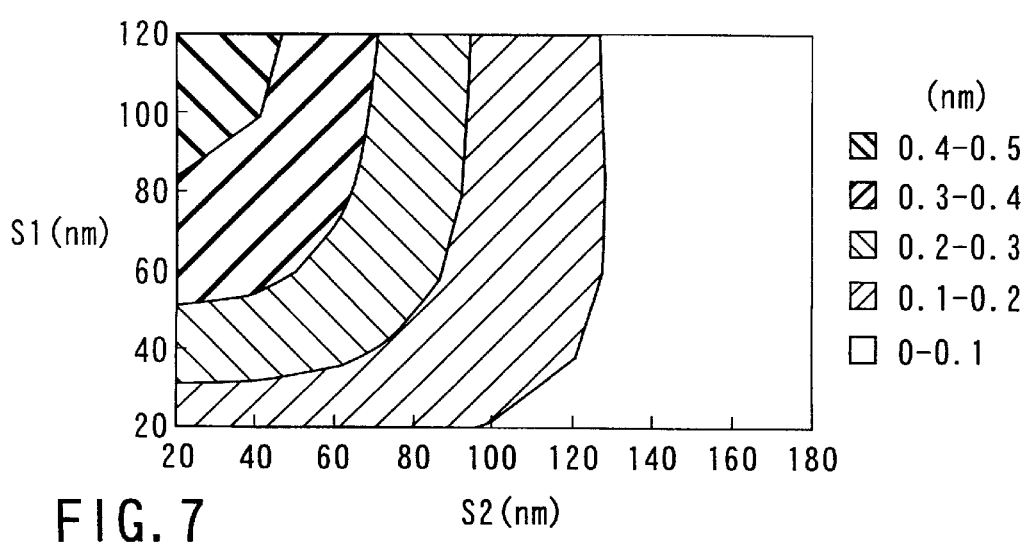
FIG. 7 is a graph showing the change amount of shortening when sb is changed by 1 nm.

FIGS. 6 and 7 are guided in the following manner. That is, arbitrary lengths $s_1$ and $s_2$ of the edges sa and sb are determined, and the shortening of the transferred pattern 7 obtained by a plan shape of the supplemental pattern 6 is defined as x. Further, the length $s_1$ is changed by $\pm\Delta s_1$. In a similar manner, the shortening x±Δx of the transferred pattern 7 obtained in a similar manner is calculated, and this shortening and the change amount ±Δx of the shortening x are calculated. By dividing this change amount ±Δx of the shortening by $\pm\Delta s_1$, the change amount of shortening in case where the length is changed by a unit length is calculated, and the result ±Δx/±Δs₁ is obtained with respect to each of the edges sa and sb. FIG. 6 has thus resulted.

Likewise, the change amount of the shortening x where the length $s_2$ of the edge sb is changed by ±Δs₂ is equivalently calculated per unit length, to obtain the value ±Δx/±Δs₂, with respect of each of the edges sa and sb. FIG. 7 has thus resulted.

Note that it is possible to obtain a photomask capable of achieving a more stable correction effect if the relationship graphs shown in FIGS. 6 and 7 are obtained by using the values of the Δs₁ and Δs₂ as fine small change amounts in the mask plane which are actually caused by the mask drawing process. In this case, variations of the dimensions of the supplemental pattern 6 which are actually caused by the drawing process may be set as the values of Δs₁ and Δs₂.

However, the values ±Δx/±Δs₁ and ±Δx/±Δs₂ which are the change amounts of the shortening per unit length obtained in FIGS. 6 and 7 are merely amounts indicating the extents of change amounts applied to the shape of the transferred pattern 7 in case where a variation is caused only one of the lateral and longitudinal directions. Therefore, a change amount s' is introduced as an actual form of a variation of the plan shape of the supplemental pattern 6, i.e., as an amount indicating the extent of a change amount effected on the plan shape of the transferred pattern 7 in case where small variations are respectively caused in both the lateral and longitudinal directions.

Figure 8:
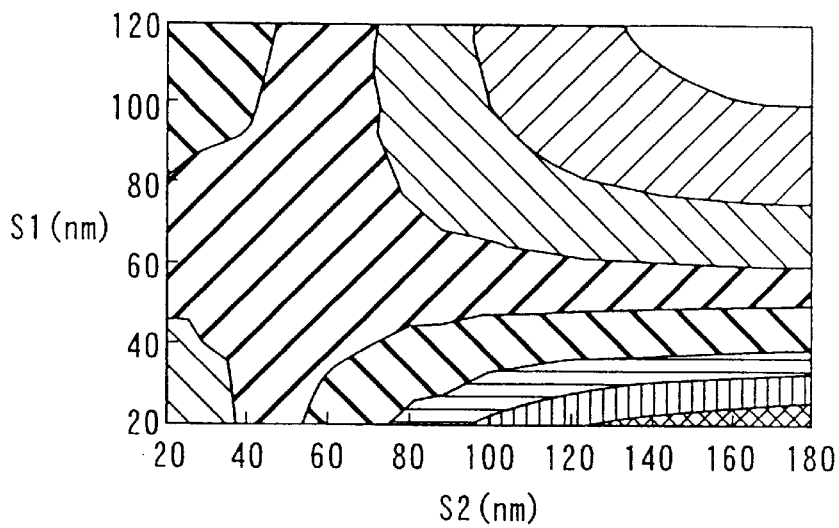
FIG. 8 is a graph showing the change amount of shortening when sa and sb are changed by a small amount.

This change amount s' is a value of a square root of a value obtained by squaring and adding the value of ±Δx/±Δs₁ in FIG. 6 and the value of ±Δx/±Δs₂ in FIG. 7, and is given by $s'=\{(\pm\Delta x/\pm\Delta s_1)^2+(\pm\Delta x/\pm\Delta s_2)^2\}^{1/2}$. The amount of this change amount s' is estimated for each of $s_1$ and $s_2$, and the results are shown in FIG. 8. This change amount s', i.e., the magnitude thereof indicates the magnitude of an influence effected on the transferred pattern shape by a change of the shape of the supplemental pattern 6. Specifically, this parameter s' indicates a change amount of the pattern plan shape on a wafer when $s_1$ and $s_2$ are changed by small amounts.

FIG. 8 shows a contour map calculated where each of the change amounts Δs₁ and Δs₂ of the shape of the supplemental pattern 6 is set to 20 nm. It is desirable that these change amounts Δs₁ and Δs₂ are set to magnitudes substantially equal to the finish precision of the supplemental pattern 6 depending on the mask preparation process.

For example, when the dimensional variation of a finished plan shape of the supplemental pattern 6 is ±5 nm or so in case where a certain mask preparation process is used, the contour map corresponding to FIG. 8 may be calculated by setting the fine change amounts Δs₁ and Δs₂ of the plan shape of the supplemental pattern to 5 nm. By thus setting the change amounts Δs₁ and Δs₂ based on an actual mask preparation process, it is possible to calculate the change amounts ±Δx/±Δs₁ and ±Δx/±Δs₂ of shortening which is much closer to actual mask preparation process. It is also possible to prepare a contour map reflecting the change amounts of actual shortening, so dimensions of the supplemental pattern 6 can be determined with higher precision.

Next, explanation will be made of a manner for designing an actual mask pattern based on the data thus estimated.

At first, based on a design pattern as shown in FIG. 1, a mask pattern 4 obtained by adding a supplemental pattern 6 to a main pattern 5 is prepared, to correct the shortening effect as shown in FIG. 2. Further, to determine the dimension values sa and sb which define the supplemental pattern 6, values sa and sb that reduce the shortening to 0 are calculated on the basis of data shown in FIG. 5.

Specifically, a relationship curve concerning $s_1$ and $s_2$ which reduces the shortening to 0 is obtained. Further, among the values of sa and sb on the relationship curve thus obtained, a combination which provides the smallest change amount so shown in FIG. 8 is extracted. Extraction of the combination is attained by layering the relationship curve shown in FIG. 5 on FIG. 8. The combination of sa and sb that minimizes the value s' is $s_1$=90 (nm) and $s_2$=100 (nm). That is, by using a mask pattern 4 which has a supplemental pattern 6 having sa and sb in this combination of dimension values, it is possible to perform pattern transfer which effects the least influence on a design error of a formed supplemental pattern 6, among the values of sa and sb on the relationship curve shown in FIG. 5.

Also, when extracting the combination of the optimum dimension values $s_1$ and $s_2$ of the supplemental pattern 6, it is possible to combine a manner of selecting a combination having the smallest values with respect to the values of Δx and Δx/Δs_i in addition to the value of s'. In this case, pattern transfer can be carried out with less influence on a design error of the supplemental pattern 6 only in the lateral direction or the longitudinal direction.

After the dimensions $s_1$ and $s_2$ of sa and sb were thus determined, a mask pattern 4 obtained by adding a supplemental pattern 6 having the determined dimension values of sa and sb to the main pattern 6 was prepared. Subsequently, exposure was carried out by the mask pattern 4, and further, a resist development step was also carried out. The shape of a finished pattern and shortening were measured to find that a pattern could be formed as desired.

If the supplemental pattern dimensions are determined in this method, it is not necessary to consider variations of the finished dimensions of the supplemental pattern 6 in the mask drawing process, but it is found that a correction effect of an optical proximity effect desired for a pattern after transfer can be stably obtained.

The above embodiment is merely one form in the case where the present invention is applied to the top end portion of a gate pattern. Needless to say, the above method is applicable to a supplemental pattern added to form corner portions of a device region of a SDG or the like with fidelity and a supplemental pattern used for correction of a line width. Further, the method is applicable to any fine patterns used for LSI device patterns. Also, it has been confirmed that a curve similar to that in FIG. 5 can be obtained in case where focus and dose are changed. Therefore, if the values corresponding to those in FIG. 8 are calculated, the present invention can be applied.

Although the exposure conditions and pattern layout have been limited in the above, the contour map shown in FIG. 8 can naturally be prepared under other exposure conditions and pattern layout, and the present invention can be applied to all kinds of masks.

Although two kinds of values $s_1$ and $s_2$ have been used as dimension values which define the supplemental pattern 6, the number of the values are not limited hitherto. For example, the present invention can be applied if the defining dimension values are three kinds or more, e.g., if a supplemental pattern to be added has a shape of a key or so. It is possible to respond to this case by obtaining a change amount for each of the defining dimension values. Likewise, two or more kinds of defining values may be used as values indicating change amounts.

Although a case where the plan shape of the supplemental pattern 6 is defined by dimensions has been indicated above, the supplemental pattern can be defined in form of an area A=sa×sb, for example. In this case, data base of a relationship graph expressing the change amount of shortening is simple and convenient and is particularly effective in case where the supplemental pattern 6 is so small that measurement of dimension values is difficult.

Also, the value which defines the supplemental pattern 6 can be standardized by an exposure wavelength λ of a light source of a projection optical system and a numerical aperture NA of a projection lens thereof. Specifically, if the value which defines the supplemental pattern 6 is a dimension $s_i$, the value is standardized by $s_i/(λ/NA)$ with respect to a small change amount of a plan shape of a fine pattern. Otherwise, if the value which defines the supplemental pattern 6 is an area $A_i$, the value is standardized by $A_i/(λ/NA)^2$ with respect to a small change amount of a plan shape of a fine pattern. As a result of this, even in case where λ and NA differ, the standardized dimension amount or area amount is determined as one single meaning. Therefore, it is possible to flexibly respond to changes of illumination conditions (λ, NA), so enormous processing and time required for designing a mask pattern can shortened.

If the supplemental pattern 6 is a rectangle and is defined by dimensions $s_1$ and $s_2$ as in the present embodiment, it is desirable that the standardized dimensions $s_1/(λ/NA)$ and $s_2/(λ/NA)$ respectively fall within ranges of 0.09 to 0.24 and 0.14 to 0.50.

SECOND EMBODIMENT

Figure 9:
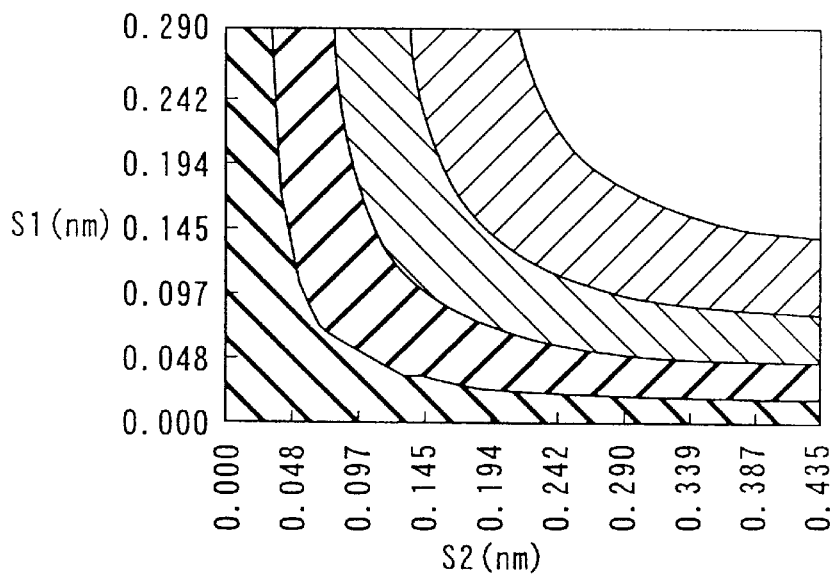
FIG. 9 is a graph showing the standardized dimension of shortening when sa and sb are changed.
Figure 10:
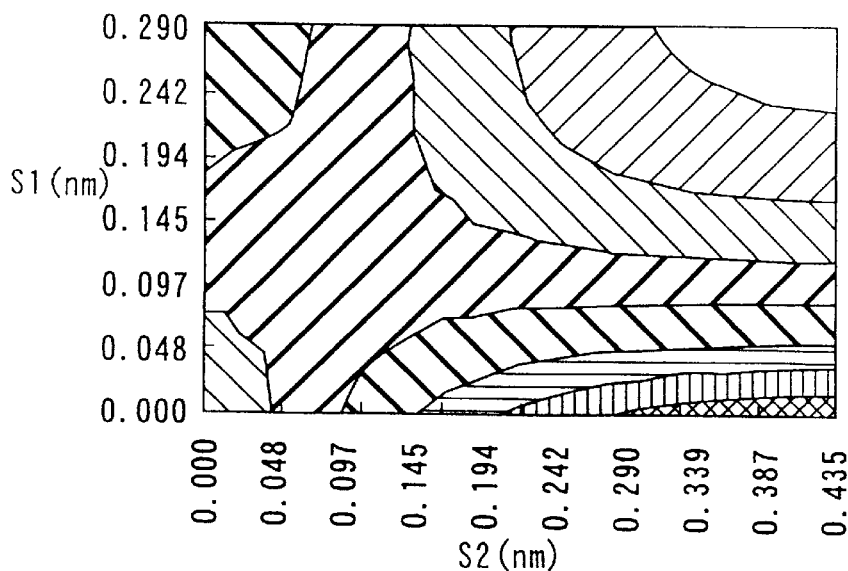
FIG. 10 is a graph showing the extent of shortening when sa and sb are changed.

FIGS. 9 and 10 are views for explaining a mask pattern design method according to the second embodiment of the present invention. The present invention is substantially the same as the first embodiment except for the point that the various parameters shown in the first embodiment are standardized.

FIG. 9 expresses the graph of FIG. 5 which indicates the amount of shortening in the first embodiment, by means of standardized dimensions with respect to respective values. FIG. 10 expresses the contour map of FIG. 8 which indicates the extent of the change of shortening in the first embodiment, by means of standardized dimension values. Specifically, in FIG. 5, the values respectively obtained by dividing the values of sa and sb by λ/NA are represented in the lateral and longitudinal axes. That is, the lateral axis represents the standardized dimension value sa/(λ/NA), and the longitudinal axis represents the standardized dimension value sb/(λ/NA). Thus, by expressing the change amount of shortening as a standardized value, the standardized dimension value is determined as one single meaning and general purpose data base can therefore be prepared, as long as λ/NA is a constant value, even if exposure is carried out under condition that the values of λ and NA differ.

Likewise, in FIG. 10, the extent of the change of shortening is obtained on the basis of the standardized dimension value shown in FIG. 9. As a result of this, the extent of the change of shortening is determined as one single meaning and general purpose data base which does not depend on the numerical aperture NA or the exposure wavelength λ can therefore be prepared, as long as λ/NA is a constant value, even if exposure is carried out under condition that the values of λ and NA differ.

Figure 11:
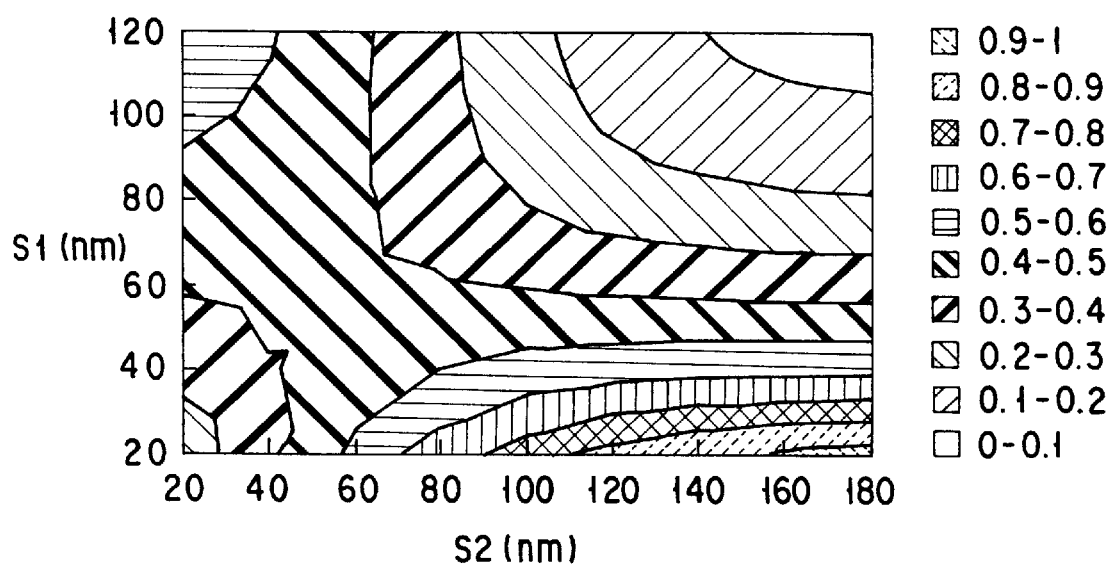
FIG. 11 is a graph showing the extent of a change of a dose amount when sa and sb are changed.

Although the above embodiment has cited an example in which a mask pattern is designed with use of a dimension value as a parameter, the present invention is not limited hitherto. FIG. 11 shows the extent of a change of a dose amount where a dose amount is used as a parameter. The longitudinal axis represents the length $s_2$ (nm) of sb, and the lateral axis represents the length $s_1$ (nm) of sa. This figure corresponds to FIG. 8. FIG. 8 shows the change rate of the shortening in form of contours. However, the change rate of the shortening can also be expressed by a change rate of a dose amount. FIG. 11 shows the change rate of the dose amount where the dimensions of the supplemental pattern are changed. The rate is expressed in units of %/nm. If the supplemental pattern is designed by thus using the dose amount as a parameter, the calculation time can be shortened in comparison with a case where a dimension value is used as a parameter. Note that the present invention is applicable to the case of calculating the change rate with use of another parameter than the dimension values and the dose amount.

As has been explained above, according to the present invention, the plan shape of a supplemental pattern is determined such that a dimensional change amount of a transferred pattern in relation to a change of a dimension of a supplemental pattern is reduced to a predetermined allowable value or less, when transferring a pattern. As a result of this, even if more or less variations are caused in designing a mask pattern, variations of a transferred pattern are reduced so that a correction effect can be obtained stably.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A mask pattern design method for designing a pattern of a photomask used for forming a desired design pattern onto a wafer by a projection exposure device, wherein a mask pattern is prepared by adding a supplemental pattern to a main pattern corresponding to the design pattern, and a plan shape of the supplemental pattern is determined such that a change rate of a pattern plan shape on the wafer after transfer, which is defined based on a change amount of the pattern plan shape on the wafer after transfer with respect to a change amount of the plan shape of the supplemental pattern, becomes a predetermined allowable value or less.

2. A mask pattern design method according to claim 1, wherein the change rate of the pattern plan shape is expressed in form of a dimension.

3. A mask pattern design method according to claim 1, wherein the change rate of the pattern plan shape is expressed in form of an area.

4. A mask pattern design method according to claim 1, wherein where an exposure wavelength of a light source of the projection exposure device is λ and a numerical aperture of a projection lens thereof is NA, the change rate of the pattern plan shape is standardized by values of λ and NA in relation to the change amount of the plan shape of the supplemental pattern.

5. A mask pattern design method according to claim 1, wherein where the plan shape of the supplemental pattern is defined by a dimension $s_i$ (i=0, 1, 2, ... m) and where a change amount of a pattern shape after transfer when the dimension $s_i$ is changed by a dimensional amount $±Δs_i$ is $±Δx_j$ (j=0, 1, 2, ... n), the dimension of the supplemental pattern is determined such that at least a pair of $\Delta x_j$ and $x_j/\Delta s_i$, or a pair of $\Delta x_j$ and a value expressed below becomes a predetermined allowable value or less with respect to all values of i and j:

$$\sum_{i=0}^{m}\sum_{j=0}^{n}(\Delta X_j/\Delta S_i)^2.$$

6. A photomask used for forming a desired design pattern onto a wafer by a projection exposure device, wherein a mask pattern of the photomask comprises a main pattern corresponding to the design pattern and a supplemental pattern added to the main pattern, and a plan shape of the supplemental pattern is determined such that a change rate of a pattern plan shape on the wafer after transfer, which is defined based on a change amount of the plan shape of the supplemental pattern and a change amount of the pattern plan shape on the wafer after transfer, becomes a predetermined allowable value or less.

7. A photomask according to claim 6, wherein
the change rate of the pattern plan shape is expressed in form of a dimension.

8. A photomask according to claim 6, wherein
the change rate of the pattern plan shape is expressed in form of an area.

9. A photomask according to claim 6, wherein where an exposure wavelength of a light source of the projection exposure device is $\lambda$ and a numerical aperture of a projection lens thereof is NA, the change rate of the pattern plan shape is standardized by values of $\lambda$ and NA in relation to the change amount of the plan shape of the supplemental pattern.

10. A photomask according to claim 6, wherein where the plan shape of the supplemental pattern is defined by a dimension $s_i$ (i=0, 1, 2, ... m) and where a change amount of a pattern shape after transfer when the dimension $s_i$ is changed by a dimensional amount $\pm\Delta s_i$ is $\pm\Delta x_j$ (j=0, 1, 2, ... n), the dimension of the supplemental pattern is determined such that at least one of $\Delta x_j$ and $\Delta x_j/\Delta s_i$, and $\Delta x_j$ and a value expressed below becomes a predetermined allowable value or less with respect to all values of i and j:

$$\sum_{i=0}^{m}\sum_{j=0}^{n}(\Delta X_j/\Delta S_i)^2.$$

* * * * *